United States Patent
Tsumori et al.

(10) Patent No.: US 9,978,913 B2
(45) Date of Patent: May 22, 2018

(54) OUTDOOR LUMINAIRE

(71) Applicant: SHIN-ETSU CHEMICAL CO., LTD., Tokyo (JP)

(72) Inventors: Toshihiro Tsumori, Echizen (JP); Toshihiko Tsukatani, Echizen (JP); Kazuhiro Wataya, Echizen (JP); Takehisa Minowa, Echizen (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days. days.

(21) Appl. No.: 14/309,993

(22) Filed: Jun. 20, 2014

(65) Prior Publication Data

US 2014/0376229 A1 Dec. 25, 2014

(30) Foreign Application Priority Data

Jun. 25, 2013 (JP) .................. 2013-132462

(51) Int. Cl.
*H01L 33/50* (2010.01)
*C09K 11/77* (2006.01)
*F21K 9/60* (2016.01)

(52) U.S. Cl.
CPC .......... *H01L 33/50* (2013.01); *C09K 11/7706* (2013.01); *C09K 11/7715* (2013.01); *C09K 11/7774* (2013.01); *F21K 9/60* (2016.08); *H01L 33/502* (2013.01)

(58) Field of Classification Search
CPC ....................................... H01L 33/50–33/508
See application file for complete search history.

(56) References Cited

U.S. PATENT DOCUMENTS

| 8,267,541 B2 | 9/2012 | Watanabe et al. |
| 2001/0050371 A1 | 12/2001 | Odaki et al. |
| 2004/0256974 A1 | 12/2004 | Mueller-Mach et al. |

(Continued)

FOREIGN PATENT DOCUMENTS

| EM | 1566426 a2 | 8/2005 |
| EP | 2088362 A1 | 8/2009 |

(Continued)

OTHER PUBLICATIONS

Shirakura, Kimitaka, et al., "The Effect of Spectral Power Distribution on the Perception of Scene Brightness in Nighttime Lit Streets", Journal of the Illuminating Engineering Institute of Japan, 2012, vol. 96, No. 5, pp. 259-272, w/ English abstract and translation, cited in Specification.

(Continued)

*Primary Examiner* — Mariceli Santiago
(74) *Attorney, Agent, or Firm* — Westerman, Hattori, Daniels & Adrian, LLP

(57) ABSTRACT

An outdoor luminaire comprising a blue LED chip having a maximum peak at a wavelength of 420-480 nm and a phosphor layer disposed forward of the LED chip in its emission direction is provided. The phosphor layer comprises a phosphor of the formula: $Lu_3Al_5O_{12}:Ce^{3+}$ which is activated with up to 1 mol % of Ce relative to Lu, the phosphor being dispersed in a resin. In scotopic and mesopic vision conditions, the luminaire produces illumination affording brighter lighting, higher visual perception and brightness over a broader area.

17 Claims, 4 Drawing Sheets

(56) References Cited

U.S. PATENT DOCUMENTS

| | | |
|---|---|---|
| 2010/0149783 A1 | 6/2010 | Takenaka et al. |
| 2011/0305005 A1 | 12/2011 | Tsukatani et al. |
| 2012/0087108 A1 | 4/2012 | Ke et al. |
| 2012/0106125 A1 | 5/2012 | Yokotani et al. |
| 2012/0112130 A1* | 5/2012 | Wu et al. ............... 252/301.4 P |
| 2012/0320585 A1* | 12/2012 | Lin ........................ F21V 5/007 362/239 |
| 2013/0140491 A1* | 6/2013 | Li et al. ................. 252/301.4 H |
| 2013/0285104 A1* | 10/2013 | Yoshimura et al. ............ 257/98 |

FOREIGN PATENT DOCUMENTS

| | | |
|---|---|---|
| EP | 2474590 A2 | 7/2012 |
| JP | 2001-267632 A | 9/2001 |
| JP | 2005-353649 A | 12/2005 |
| JP | 2007-36200 A | 2/2007 |
| JP | 2008-135381 A | 6/2008 |
| JP | 2009-151967 A | 7/2009 |
| JP | 2010-141171 A | 6/2010 |
| JP | 4787521 B2 | 10/2011 |
| JP | 2012-9434 A | 1/2012 |
| JP | 2012-17454 A | 1/2012 |
| JP | 2012-38504 A | 2/2012 |
| JP | 2012-49333 A | 3/2012 |
| JP | 2012-227017 A | 11/2012 |
| JP | 2013-123076 A | 6/2013 |
| WO | 2012-010702 A1 | 1/2012 |
| WO | 2012106282 A1 | 8/2012 |

OTHER PUBLICATIONS

Extended European Search Report dated Dec. 17, 2014, issued in European Application No. 14173102.6. (6 pages).
Office Action dated Jan. 17, 2017, issued in Japanese Application No. 2013-132462 (5 pages).
Office Action dated Oct. 17, 2017, issued in counterpart Japanese Application No. 2013-132462, with English translation (8 pages).
Korean Office Action dated Nov. 14, 2017, issued in counterpart Korean Patent Application No. 10-2014-0077521 with English translation.

* cited by examiner

OUTDOOR LUMINAIRE

CROSS-REFERENCE TO RELATED APPLICATION

This non-provisional application claims priority under 35 U.S.C. §119(a) on Patent Application No. 2013-132462 filed in Japan on Jun. 25, 2013, the entire contents of which are hereby incorporated by reference.

TECHNICAL FIELD

This invention relates to an outdoor luminaire suitable for installation in those areas that are dim or dark at night or where least lamps are available, for example, pathways, roadways, plazas, residential areas, and tunnels.

BACKGROUND ART

In modern cities, most areas are brightly illuminated even at night by many light sources including automobile headlights and store illuminations. On the other hand, most areas in suburbs and provincial districts are dark at night. Thus such areas as pathways, roadways, parks, and tunnels are provided with streetlights and outdoor luminaires for the safety and security purposes.

However, when high-intensity luminaires are installed in suburbs and provincial districts and turned on at night to produce bright illumination, there arise problems including nuisance to the neighborhood, excessive power consumption, and high installation costs. It would be desirable to have outdoor luminaires which can attain the purposes of safety, security and crime prevention without excessive power consumption.

When the light source for streetlights and outdoor luminaires is considered from the standpoints of maintenance and economy, LED lamps are of greater interest, because the LED lamps are advantageous in power consumption and lifetime over traditional incandescent lamps and fluorescent lamps. LED lamps come with a wide variation of light emission. Among them, blue LED lamps that produce light including a blue component may be used as the light source for outdoor luminaires, typically blue streetlights which are nowadays on widespread use. The power utility efficiency of LED lamps is very high. The power necessary for LED lamps to provide an equivalent illuminance is as low as ⅕ or less of the power consumed by incandescent lamps. LED lamps are generally believed to have a lifetime of several tens of thousands hours, leading to savings of labor and cost for maintenance service. For these reasons, LED lamps are suited for use in streetlights and outdoor luminaires which are intended for long-term continuous operation.

White LED packages for general lighting application have the structure that a phosphor is coated on a front surface of a blue LED chip having emission wavelength of 440 to 470 nm, or a phosphor layer is disposed immediately forward of a blue LED chip in emission direction. With this structure, blue light is irradiated from the chip to the phosphor, which in turn, emits broad luminescent light having a peak wavelength around 550 nm, which is combined with blue light of unconverted wavelength to produce white light. White LED lamps for most luminaires utilize luminescent light having a peak wavelength of about 550 nm because human eyes have a high sensitivity to light of wavelength near 555 nm. In principle, light rich in this wavelength component provides highly effective lighting. However, it is known that under scotopic vision conditions at night streets or under mesopic vision conditions immediately after sunset, the peak wavelength of human visual sensitivity shifts from 555 nm to the shorter wavelength side as shown in FIG. 7. This is known as the Purkinje effect.

Under scotopic and mesopic vision conditions, among outdoor luminaires using white LEDs, those having an emission peak shifted to a wavelength shorter than 555 nm are preferred. For night lighting, luminaires having a high color temperature are under study (Non-Patent Document 1). These prior art night-lighting luminaires are not regarded as complying with a change of visual sensitivity based on the Purkinje effect because the light does not fully contain wavelength components of the highest visual sensitivity at the scotopic and mesopic vision levels.

CITATION LIST

Patent Document 1: JP-A 2008-135381 (U.S. Pat. No. 8,267,541, EP 2088362)
Patent Document 2: JP-A 2009-151967
Patent Document 3: JP-A 2012-038504
Patent Document 4: JP-A 2012-009434
Non-Patent Document 1: Shirokura et al., "Influence on spatial brightness of spectral characteristics of streetlights", Journal of the Illuminating Engineering Institute of Japan, Vol. 96, No. 5, 259-271 (2012)

SUMMARY OF INVENTION

An object of the invention is to provide an outdoor luminaire which produces illumination affording brighter lighting, higher visual perception and brightness over a broader range under scotopic and mesopic vision conditions as often encountered in suburbs, provincial districts, rural districts and tunnels.

Recently, the street-lighting system employs an increasing number of blue streetlights which are constructed by covering a fluorescent lamp with a blue cover so as to produce light of cold color. That is, the effect of cold color light like blue light exerting certain tranquility or sedation to human psychology is utilized for the security light. Attempts are now made to design LED streetlights as blue streetlights. However, these streetlights are merely designed so as to increase the quantity of blue light, without taking into account the visual sensitivity under scotopic and mesopic vision conditions.

The inventors looked for the LED lighting that could mitigate a lowering of visual perception due to a change of visual sensitivity (or luminosity) wavelength under scotopic and mesopic vision conditions. Focusing on $Lu_3Al_5O_{12}$:$Ce^{3+}$ phosphor (LuAG phosphor) for use with blue LED as the light source/phosphor combination, the inventors made a study to improve the brightness perception and visual perception under scotopic and mesopic vision conditions of an LED lighting based on a combination of blue LED with LuAG phosphor.

It is known that the LuAG phosphor is a yellowish green luminescent phosphor capable of emitting luminescent light having a peak wavelength of 520 to 560 nm in response to blue light. In the case of $Y_3Al_5O_{12}$:$Ce^{3+}$ (YAG phosphor) having a similar structure to the LuAG phosphor, part of Al is replaced by Ga in order to acquire emission of shorter wavelength, but at the sacrifice of quantum efficiency of the phosphor. It may be contemplated to replace part of Al by Ga in LuAG phosphor. However, such replacement is undesirable for lighting applications because a lowering of quantum efficiency of the phosphor is expected.

Now that the emission of LuAG phosphor has a spectrum of two overlapping emission profiles rather than a single emission profile, and the two emission profiles are assigned to $5d\rightarrow{}^2F_{5/2}$ transition (emission peak on the shorter wavelength side) and $5d\rightarrow{}^2F_{7/2}$ transition (emission peak on the longer wavelength side) of $Ce^{3+}$ ion, the inventors presumed that if the emission profiles are controlled, the quantity of light emission of shorter wavelength may be increased and as a result, lighting suitable for use under scotopic and mesopic vision conditions is available.

The inventors have found that for LuAG phosphor, the probability of $5d\rightarrow{}^2F_{5/2}$ transition (emission peak on the shorter wavelength side) and $5d\rightarrow{}^2F_{7/2}$ transition (emission peak on the longer wavelength side) of $Ce^{3+}$ ion is governed by the concentration of Ce; that by controlling the Ce concentration, the probability of $5d\rightarrow{}^2F_{5/2}$ transition can be increased whereby the quantity of light emission near 510 nm having a high visual sensitivity under scotopic and mesopic vision conditions can be increased; and that by combining LuAG phosphor with blue LED, lighting suitable as outdoor lighting or night lighting is available.

Attention is paid to Ce added as the activator to LuAG phosphor. When a percent activation rate of Ce relative to Lu is equal to or less than 1 mol %, the proportion of $5d\rightarrow{}^2F_{5/2}$ transition becomes high, and so the proportion of light emission near 510 nm that is advantageous under scotopic and mesopic vision conditions is increased. When blue LED is combined with a LuAG phosphor having a Ce activation rate of up to 1 mol % relative to Lu, an outdoor lighting which is more useful under scotopic and mesopic vision conditions than the prior art is available.

Accordingly, the invention provides an outdoor luminaire comprising a blue LED chip having a maximum peak at a wavelength of 420 to 480 nm and a phosphor layer disposed forward of the LED chip in its emission direction. The phosphor layer comprises a phosphor mixed and dispersed in a resin, and the phosphor has the compositional formula (1):

$$Lu_3Al_5O_{12}:Ce^{3+} \quad (1)$$

and a Ce-activation rate relative to Lu of up to 1 mol %.

In one preferred embodiment, the resin is a silicone resin or epoxy resin. In another preferred embodiment, the resin is at least one thermoplastic resin selected from among polyethylene, polypropylene, polyvinyl chloride, polyethylene terephthalate, polycarbonate, polystyrene, and ABS resin.

The luminaire provides light having an intensity S1 at wavelength 510 nm and an intensity S2 at wavelength 545 nm, wherein the ratio of S1/S2 is preferably at least 0.95.

Advantageous Effects of Invention

The outdoor luminaire of the invention produces illumination affording brighter lighting, higher visual perception and brightness over a broader range under scotopic and mesopic vision conditions.

DESCRIPTION OF PREFERRED EMBODIMENTS

Figure 1:
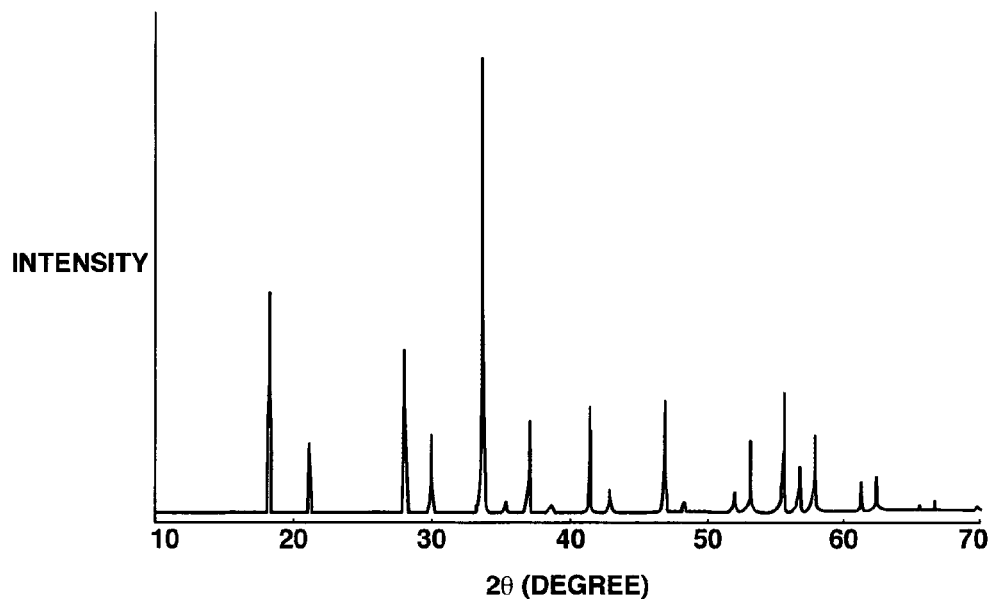
FIG. 1 is a diagram showing the X-ray diffraction (XRD) profile of $Lu_3Al_5O_{12}:Ce^{3+}$ phosphor in Example 1.

One embodiment of the invention is an outdoor luminaire (or lighting equipment) comprising a blue LED chip having a maximum peak in the wavelength range of 420 to 480 nm. The blue LED chip may be a well-known blue LED package in which a blue LED chip, wirings and the like are sealed with an encapsulant. Any of well-known or commercially available blue LED packages may be used. Those blue LED chips having a maximum peak at a shorter or longer wavelength than the wavelength range defined above are undesirable because the excitation efficiency of phosphor is extremely reduced.

The outdoor luminaire also comprises a phosphor layer which is disposed forward of the blue LED chip in its emission direction. The phosphor layer has a phosphor mixed and dispersed in a resin, the phosphor having the compositional formula (1):

$$Lu_3Al_5O_{12}:Ce^{3+} \quad (1)$$

and a Ce-activation rate relative to Lu (i.e., a proportion of Ce based on the sum of Lu and Ce) of up to 1 mol %, preferably at least 0.1 mol %. This phosphor is often referred to as "LuAG phosphor." Preferably the phosphor layer contains at least 0.1% by weight and up to 50% by weight of the LuAG phosphor of formula (1).

If the Ce-activation rate relative to Lu exceeds 1 mol %, a proportion of $5d\rightarrow{}^2F_{7/2}$ transition becomes higher than a proportion of $5d\rightarrow{}^2F_{5/2}$ transition, the peak position of emission spectrum shifts toward the longer wavelength side, and the emission wavelength largely deviates from the visual sensitivity under scotopic or mesopic vision, resulting in lighting with poor brightness under scotopic or mesopic vision. If the Ce-activation rate relative to Lu is less than 0.1 mol %, the phosphor itself has a poor absorptivity with the risk that light near wavelength 510 nm giving bright perception under scotopic or mesopic vision may become short.

The LuAG phosphor used herein is in particulate form. From the aspect of emission efficiency, the phosphor particles preferably have an average particle size of 1.5 to 50 microns (μm). If the average particle size is less than 1.5 μm, the emission efficiency of phosphor may lower, with a drop of lighting efficiency. If the average particle size exceeds 50 μm, this raises no problems with respect to lighting characteristics, but a larger amount of phosphor must be used to increase the number of particles, undesirably leading to an increased cost. The particle size of phosphor particles may be determined, for example, by dispersing phosphor particles in a gas or water stream and measuring their size by the laser diffraction scattering method.

The LuAG phosphor used herein may be prepared by well-known methods. For example, lutetium oxide, cerium oxide and aluminum oxide in powder form are mixed in such amounts as to meet the desired composition. Barium fluoride is added thereto as a flux. The powder mixture is heated at a high temperature in air, an inert atmosphere (e.g., nitrogen) or reducing atmosphere (e.g. argon partly replaced by hydrogen) to form a complex oxide, which is disintegrated on a ball mill or the like to an appropriate size.

In the phosphor layer, a phosphor other than the LuAG phosphor of formula (1) may be used for the purposes of improving the tone and color rendering of outdoor lighting as long as the objects of the invention are not impaired.

The resin of the phosphor layer may be either transparent or semi-transparent. For example, silicone resins and epoxy resins may be used. The phosphor layer may be formed by mixing and dispersing phosphor particles in an uncured resin composition, applying the resin composition to the surface of a blue LED chip or package, and curing the resin composition. Alternatively, a phosphor-loaded resin composition may be molded and cured to form a phosphor layer, which is disposed forward of a blue LED chip or package in its emission direction.

In another preferred embodiment, the resin of the phosphor layer is a thermoplastic resin selected from among polyethylene, polypropylene, polyvinyl chloride, polyethylene terephthalate, polycarbonate, polystyrene, and ABS resin, alone or in admixture of two or more. Where a thermoplastic resin is used, a phosphor layer may be formed by milling phosphor particles with the thermoplastic resin for thereby dispersing the phosphor in the resin, and molding the resin, and the phosphor layer be disposed forward of a blue LED chip or package in its emission direction.

For shaping of the phosphor layer, any well-known molding methods such as compression molding, extrusion molding and injection molding may be used. The material may be molded to any desired shape such as film or thin plate and to any desired size. The shape and size of the phosphor layer may be selected as appropriate depending on the application form of the phosphor layer. Typically the thickness of the phosphor layer is in a range of about 0.5 to 3 mm, though not particularly limited.

Besides the phosphor and resin, additives may be used in the phosphor layer as long as the objects of the invention are not impaired. Suitable additives include auxiliary agents for improving weather resistance or preventing UV-induced degradation, such as radical scavengers and antioxidants, and light scattering agents for promoting light scattering, such as silica and talc. The content of such additive is typically up to 10% by weight, preferably 0.01 to 5% by weight of the phosphor layer.

Preferably the outdoor luminaire takes the form of remote phosphor type in which the phosphor layer, especially the phosphor layer based on a thermoplastic resin is spaced apart from the blue LED package via a gas or vacuum layer.

Since the luminaire of remote phosphor type has luminous intensity distribution characteristics different from general LED lamps, typically surface emission and a large radiation angle, it is particularly suited as the luminaire intended to provide illumination over a broad area.

In a preferred embodiment, the outdoor luminaire produces light having an intensity S1 at wavelength 510 nm and an intensity S2 at wavelength 545 nm, wherein the ratio of S1/S2 is at least 0.95, more preferably at least 1. The luminaire is capable of complying with a change of visual sensitivity based on the Purkinje effect because the light is full of wavelengths giving a high visual sensitivity at scotopic and mesopic vision levels.

The luminaire of the invention is suitable for installation in those areas with less brightness at night or where least light is available nearby, for example, pathways, roadways, plazas, residential areas, and tunnels. It is suitable for outdoor use, typically as streetlight. It may also be used indoor if the indoor area is in a similar dark environment, because it is suitable for use in scotopic and mesopic vision conditions.

EXAMPLE

Examples and Comparative Examples are given below by way of illustration and not by way of limitation.

Example 1

A powder mixture, 1,000 g, was obtained by mixing lutetium oxide ($Lu_2O_3$) powder of 99.9% purity having an average particle size of 1.0 μm, aluminum oxide ($Al_2O_3$) powder of 99.0% purity having an average particle size of 0.5 μm, and cerium oxide ($CeO_2$) powder of 99.9% purity having an average particle size of 0.2 μm in a molar ratio Lu:Al:Ce of 2.97:5.0:0.03. Barium fluoride, 200 g, as flux was added to the powder mixture, which was thoroughly mixed. The mixture was placed in an alumina crucible and heat treated in argon gas at 1,400° C. for 10 hours. The fired product was disintegrated on a ball mill, washed with about 0.5 mol/L hydrochloric acid and then with deionized water. Subsequent solid/liquid separation and drying yielded $Lu_3Al_5O_{12}:Ce^{3+}$ phosphor particles (Ce-activation rate relative to Lu is 1 mol %) having an average particle size of 20 μm.

The result of XRD analysis of the phosphor particles is shown in FIG. 1. The diffraction pattern of main phase of the phosphor particles is coincident with the diffraction peaks of lutetium aluminum garnet phase, demonstrating that $Lu_3Al_5O_{12}:Ce^{3+}$ containing garnet phase as main phase is obtained.

The $Lu_3Al_5O_{12}:Ce^{3+}$ phosphor particles were dispersed in a transparent epoxy resin (SpeciFix-40 kit by Marumoto Struers K.K.) to form a slurry having a phosphor concentration of 20 wt %. The slurry was added dropwise to the emissive surface of a blue LED package (NS6b083T by Nichia Corp.) and cured at 50° C. for 3 hours, completing an LED package having a phosphor layer containing phosphor particles mixed and dispersed in epoxy resin.

Figure 2A:
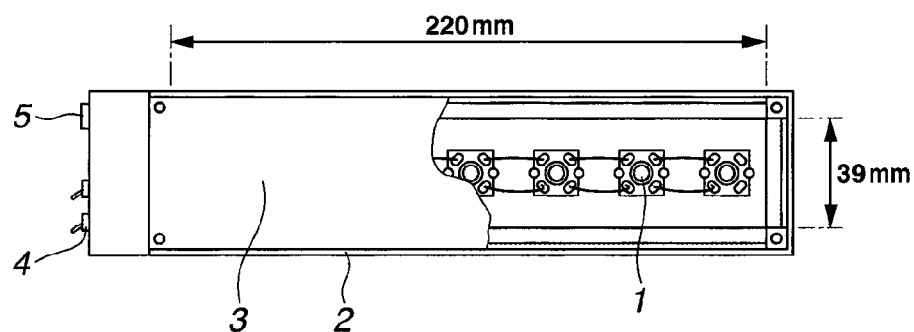
FIG. 2A and FIG. 2B illustrate an LED luminaire manufactured in Examples and Comparative Examples, (A) being a partly cut-away plan view and (B) being a perspective view.
Figure 2B:
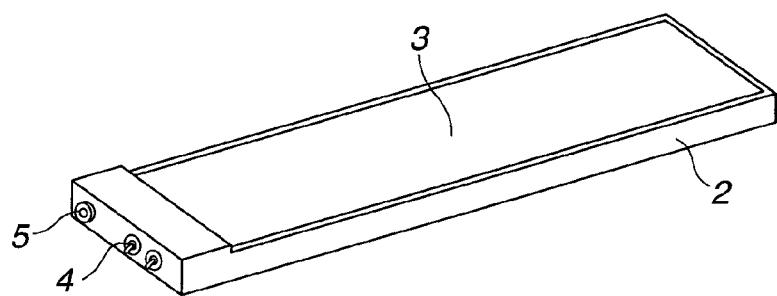

Seven LED packages thus manufactured were arranged in a rectangular aluminum chassis of 39 mm wide, 220 mm long, and 30 mm deep (inside size) and connected in series. A transparent matt acrylic plate of 2 mm thick as a protective cover was attached at a position spaced 25 mm apart from the emissive surface of the LED packages. An LED luminaire was fabricated as shown in FIG. 2, wherein LED packages 1, aluminum chassis 2, protective cover 3, power supply terminals 4, and power switch 5 are depicted.

Figure 3:
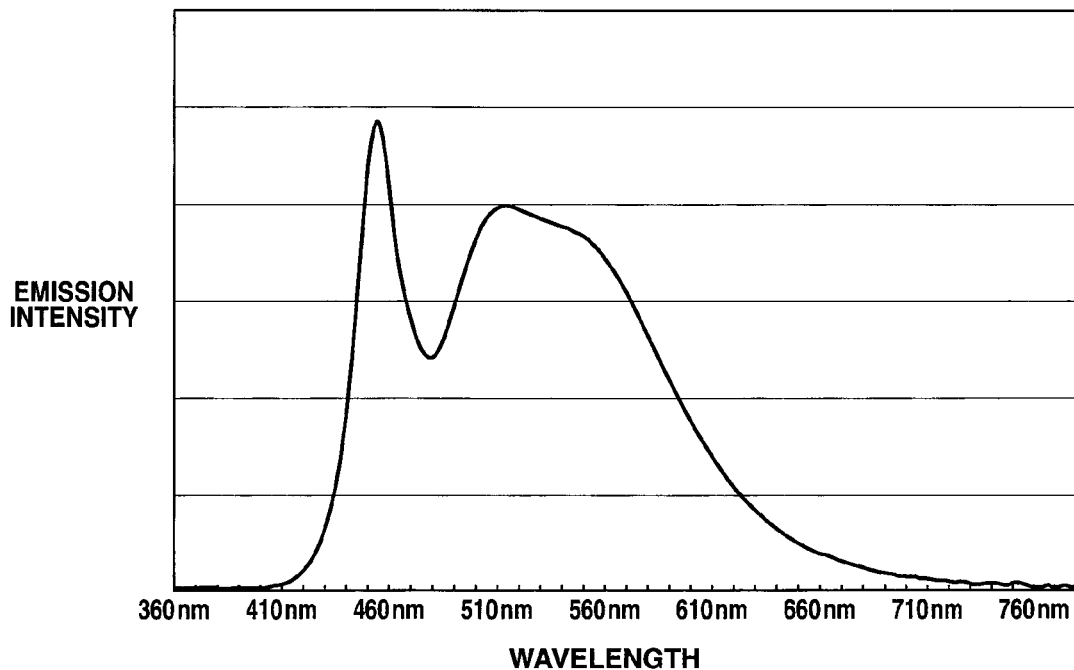
FIG. 3 is a diagram showing the spectral profile of emission from an LED luminaire of Example 1.

The spectrum of illuminating light of the LED luminaire was measured by an illuminance spectrophotometer CL-500 (Konica Minolta, Inc.). The result is shown in FIG. 3. In the spectrum, an intensity S1 at wavelength 510 nm and an intensity S2 at wavelength 545 nm were measured, from which a ratio S1/S2 was calculated to be 1.076.

Example 2

A powder mixture, 1,000 g, was obtained by mixing yttrium oxide ($Y_2O_3$) powder of 99.9% purity having an average particle size of 1.0 μm, aluminum oxide ($Al_2O_3$) powder of 99.0% purity having an average particle size of 0.5 μm, and cerium oxide ($CeO_2$) powder of 99.9% purity having an average particle size of 0.2 μm in a molar ratio Y:Al:Ce of 2.94:5.0:0.06. Barium fluoride, 200 g, as flux was added to the powder mixture, which was thoroughly mixed. The mixture was placed in an alumina crucible and heat treated in argon gas at 1,400° C. for 10 hours. The fired product was disintegrated on a ball mill, washed with about 0.5 mol/L hydrochloric acid and then with deionized water. Subsequent solid/liquid separation and drying yielded $Y_3Al_5O_{12}$:$Ce^{3+}$ phosphor particles having an average particle size of 20 μm.

An LED package with a phosphor layer was manufactured as in Example 1 except that the $Lu_3Al_5O_{12}$:$Ce^{3+}$ phosphor particles in Example 1 and the $Y_3Al_5O_{12}$:$Ce^{3+}$ phosphor particles in Example 2 were dispersed in the transparent epoxy resin in an amount of 15 wt % and 5 wt %, respectively. Using the packages, an LED luminaire was similarly fabricated.

The spectrum of illuminating light of the LED luminaire was measured as in Example 1. The intensity ratio S1/S2 was 0.983.

Example 3

Seven blue LED packages (XLamp LX-E Royal Blue by Cree Inc.) were arranged in an aluminum chassis and connected in series as in Example 1. The $Lu_3Al_5O_{12}$:$Ce^{3+}$ phosphor particles in Example 1 were kneaded in polycarbonate in a phosphor concentration of 5 wt %, and the resulting PC compound was molded into a PC plate of 2 mm thick. This PC plate as the phosphor layer was attached at a position spaced 25 mm apart from the emissive surface of the blue LED packages. An LED luminaire of remote phosphor type was fabricated as shown in FIG. 2, wherein the protective cover 3 also serves as a phosphor layer.

The spectrum of illuminating light of the LED luminaire was measured as in Example 1. The intensity ratio S1/S2 was 1.067.

Comparative Example 1

An LED package with a phosphor layer was manufactured as in Example 1 except that the phosphor used was the $Y_3Al_5O_{12}$:$Ce^{3+}$ phosphor particles in Example 2 alone. Using the packages, an LED luminaire was similarly fabricated.

Figure 4:
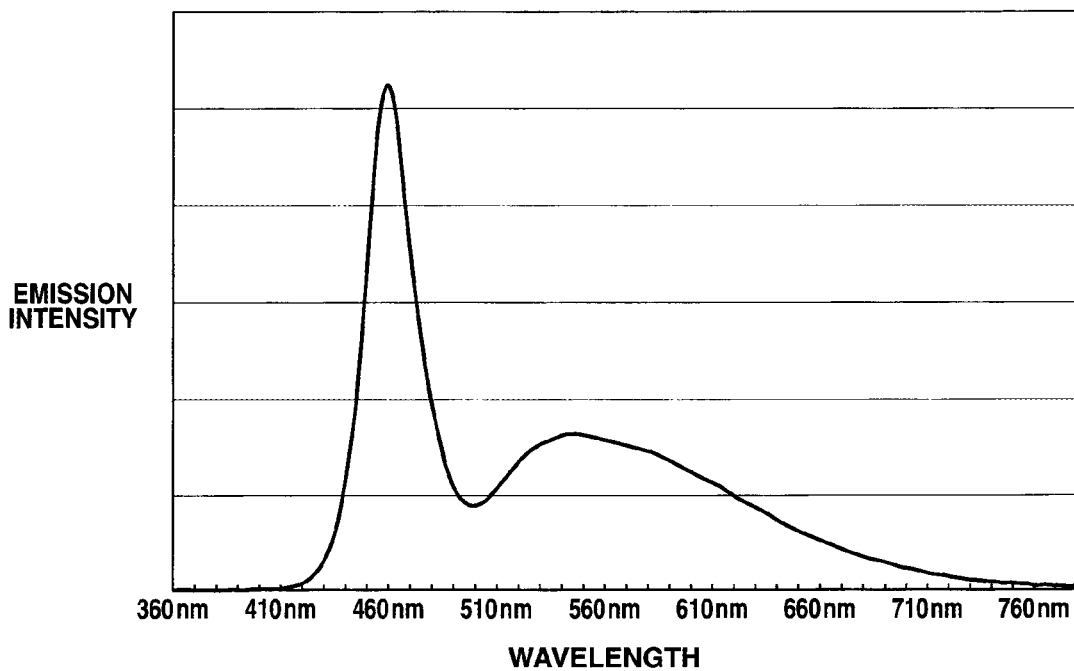
FIG. 4 is a diagram showing the spectral profile of emission from an LED luminaire of Comparative Example 1.

The spectrum of illuminating light of the LED luminaire was measured by the spectrophotometer CL-500, with the result shown in FIG. 4. In the spectrum, an intensity S1 at wavelength 510 nm and an intensity S2 at wavelength 545 nm were measured, from which a ratio S1/S2 was calculated to be 0.668.

Comparative Example 2

Seven white LED packages (XLamp LX-E Cool White by Cree Inc.) were arranged in an aluminum chassis and connected in series as in Example 1. A transparent matt acrylic plate of 2 mm thick as a protective cover was attached at a position spaced 25 mm apart from the emissive surface of the LED packages. An LED luminaire was fabricated as shown in FIG. 2.

The spectrum of illuminating light of the LED luminaire was measured as in Example 1. The intensity ratio S1/S2 was 0.657.

Comparative Example 3

A powder mixture, 1,000 g, was obtained by mixing lutetium oxide ($Lu_2O_3$) powder of 99.9% purity having an average particle size of 1.0 μm, aluminum oxide ($Al_2O_3$) powder of 99.0% purity having an average particle size of 0.5 μm, and cerium oxide ($CeO_2$) powder of 99.9% purity having an average particle size of 0.2 μm in a molar ratio Lu:Al:Ce of 2.94:5.0:0.06. Barium fluoride, 200 g, as flux was added to the powder mixture, which was thoroughly mixed. The mixture was placed in an alumina crucible and heat treated in argon gas at 1,400° C. for 10 hours. The fired product was disintegrated on a ball mill, washed with about 0.5 mol/L hydrochloric acid and then with deionized water. Subsequent solid/liquid separation and drying yielded $Lu_3Al_5O_{12}$:$Ce^{3+}$ phosphor particles (Ce-activation rate relative to Lu is 2 mol %) having an average particle size of 20 μm.

The phosphor particles were analyzed by XRD. The diffraction pattern of main phase of the phosphor particles is coincident with the diffraction peaks of lutetium aluminum garnet phase, demonstrating that $Lu_3Al_5O_{12}$:$Ce^{3+}$ containing garnet phase as main phase is obtained.

Figure 5:
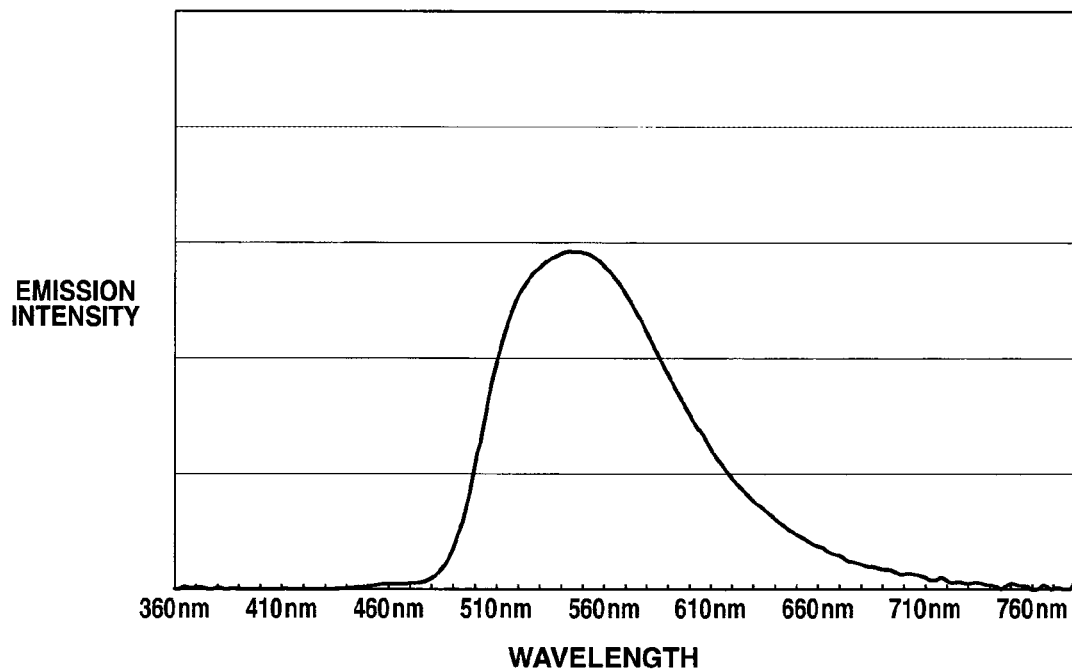
FIG. 5 is a diagram showing the luminescent spectral profile of $Lu_3Al_5O_{12}:Ce^{3+}$ phosphor in Comparative Example 3 in response to excitation light of wavelength 450 nm.

The luminescent spectrum of this phosphor in response to excitation light of wavelength 450 nm was measured by the spectrophotometer CL-500, with the result shown in FIG. 5. This phosphor's emission peak near wavelength 510 nm was lower than at wavelength 545 nm.

An LED package with a phosphor layer was manufactured as in Example 1 except that the phosphor used was the $Lu_3Al_5O_{12}$:$Ce^{3+}$ phosphor particles (Ce-activation rate relative to Lu is 2 mol %) in Comparative Example 3. Using the packages, an LED luminaire was similarly fabricated.

Figure 6:
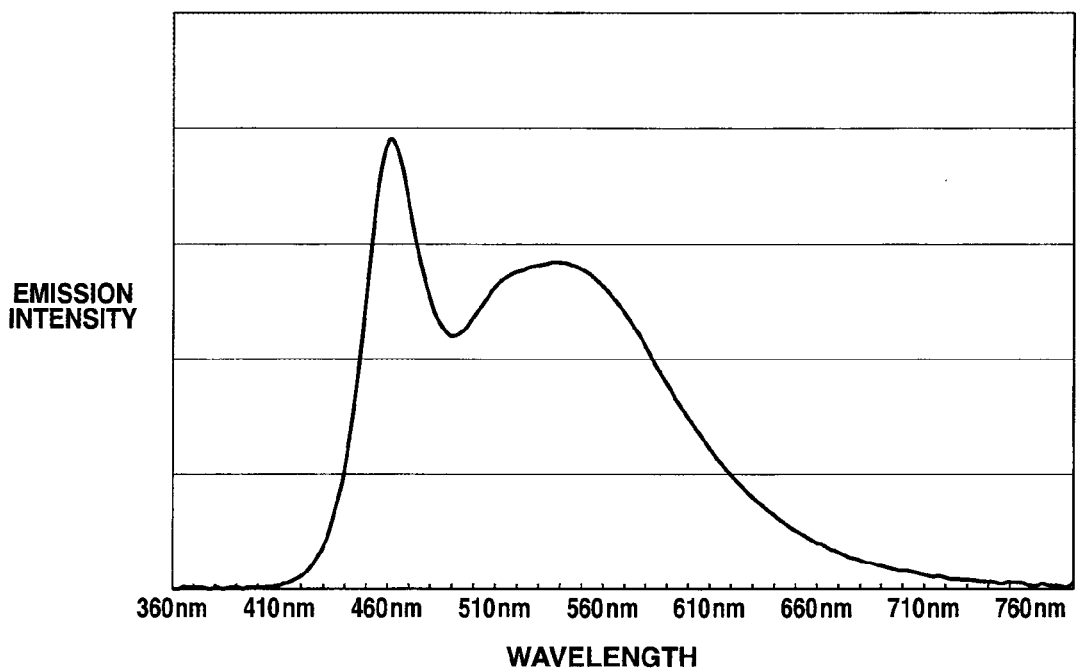
FIG. 6 is a diagram showing the spectral profile of emission from an LED luminaire of Comparative Example 3.
Figure 7:
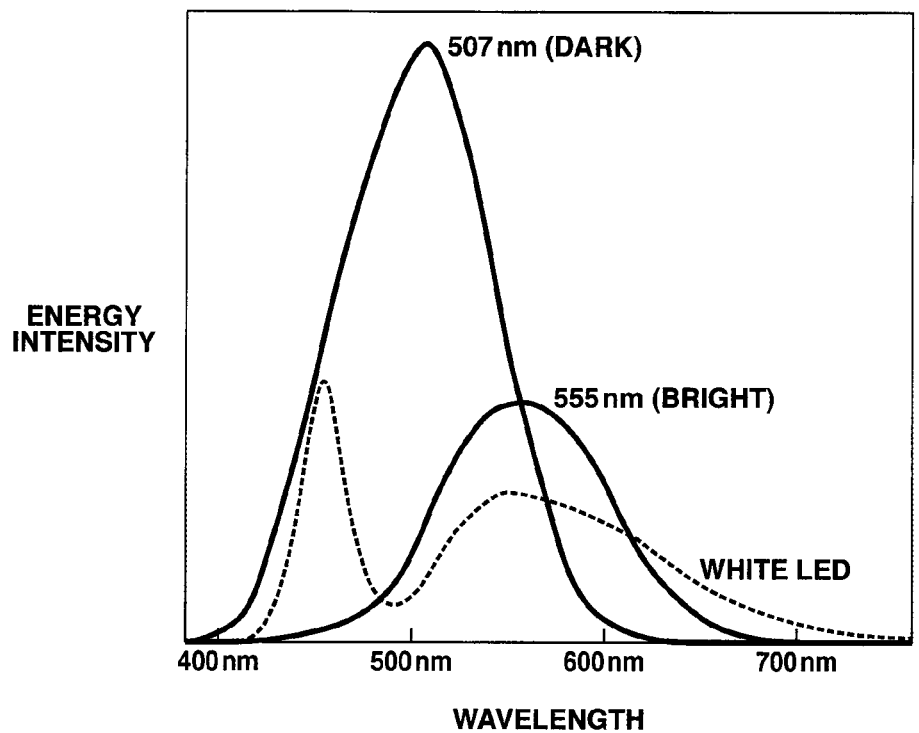
FIG. 7 is a diagram showing the emission spectrum (broken line) of a general white LED, and the peak wavelength (555 nm) in bright room and the peak wavelength (507 nm) in dark room of human eye sensitivity.

The spectrum of illuminating light of the LED luminaire was measured by the spectrophotometer CL-500, with the result shown in FIG. 6. In the spectrum, an intensity S1 at wavelength 510 nm and an intensity S2 at wavelength 545 nm were measured, from which a ratio S1/S2 was calculated to be 0.939.

The LED luminaires of Examples 1 to 3 and Comparative Examples 1 to 3 were mounted at the top of posts along an asphalt roadway at a height of 3 m, and burned at night by applying a voltage of 24 V. The road surface and adjacent objects were visually observed. The LED luminaires of Examples were superior to the LED luminaires of Comparative Examples in that the space looked bright, shadows were less, and adjacent objects were clearly seen.

It has been demonstrated that the LED luminaires of Examples are excellent outdoor luminaires in that they produce effective lighting providing improved visual perception over a broader space including brightness of the overall space and brightness at the adjacent region. The LED luminaire of remote phosphor type in Example 3 provides surface emission, and due to an accordingly wide spread of illumination, non-glare lighting with less shadows is available. Since the luminaire of the invention produces lighting capable of complying with a change of visual sensitivity based on the Purkinje effect under scotopic and mesopic vision conditions, it is best suited for outdoor lighting.

Japanese Patent Application No. 2013-132462 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. An outdoor luminaire comprising a blue LED chip having a maximum peak at a wavelength of 420 to 480 nm and a phosphor layer disposed forward of the LED chip in its emission direction, said phosphor layer comprising a phosphor mixed and dispersed in a resin, the phosphor having the compositional formula (1):

$$Lu_3Al_5O_{12}:Ce^{3+} \qquad (1)$$

and a Ce-activation rate relative to Lu of up to 1 mol %, and the phosphor being obtained by a method comprising the step of mixing lutetium oxide, cerium oxide and aluminum oxide in powder form, and heating the mixture in air, an inert atmosphere or a reducing atmosphere to form a complex oxide, and disintegrating the complex oxide, wherein the luminaire provides light having an intensity S1 at wavelength 510 nm and an intensity S2 at wavelength 545 nm, the ratio of S1/S2 being at least 0.95, and the phosphor layer comprises the phosphor of at least 0.1% and up to 50% by weight of the phosphor layer.

2. The luminaire of claim 1 wherein the resin is a silicone resin or epoxy resin.

3. The luminaire of claim 1 wherein the resin is at least one thermoplastic resin selected from the group consisting of polyethylene, polypropylene, polyvinyl chloride, polyethylene terephthalate, polycarbonate, polystyrene, and ABS resin.

4. The luminaire of claim 1 which provides the light having the ratio of S1/S2 being at least 1.

5. The luminaire of claim 1 wherein the phosphor layer is spaced apart from the blue LED chip.

6. The luminaire of claim 1 wherein said Ce-activation rate relative to Lu is at least 0.1 mol %.

7. The luminaire of claim 1 which is a streetlight or light for a pathway, roadway, plaza, outdoor residential area or tunnel.

8. The luminaire of claim 1, wherein in the heating step, the mixture is heated in air or an inert atmosphere.

9. A method of outdoor illumination using an outdoor luminaire comprising a blue LED chip having a maximum peak at a wavelength of 420 to 480 nm and a phosphor layer disposed forward of the LED chip in its emission direction, said phosphor layer comprising a phosphor mixed and dispersed in a resin, the phosphor having the compositional formula (1):

$$Lu_3Al_5O_{12}:Ce^{3+} \qquad (1)$$

and a Ce-activation rate relative to Lu of up to 1 mol %, and the phosphor being obtained by a method comprising the step of mixing lutetium oxide, cerium oxide and aluminum oxide in powder form, and heating the mixture in air, an inert atmosphere or a reducing atmosphere to form a complex oxide, and disintegrating the complex oxide, wherein the phosphor layer comprises the phosphor of at least 0.1% and up to 50% by weight of the phosphor layer.

10. The method of claim 9 wherein the resin is a silicone resin or epoxy resin.

11. The method of claim 9 wherein the resin is at least one thermoplastic resin selected from the group consisting of polyethylene, polypropylene, polyvinyl chloride, polyethylene terephthalate, polycarbonate, polystyrene, and ABS resin.

12. The method of claim 9 wherein the luminaire provides light having an intensity S1 at wavelength 510 nm and an intensity S2 at wavelength 545 nm, the ratio of S1/S2 being at least 0.95.

13. The method of claim 12 wherein the luminaire provides light having the ratio of S1/S2 being at least 1.

14. The method of claim 9 wherein the luminaire of remote phosphor type in which the phosphor layer is spaced apart from the blue LED chip.

15. The method of claim 9 wherein said Ce-activation rate relative to Lu is at least 0.1 mol %.

16. The method of claim 9, wherein the luminaire is a streetlight or light for a pathway, roadway, plaza, outdoor residential area or tunnel.

17. The method of claim 9, wherein in the heating step, the mixture is heated in air or an inert atmosphere.

* * * * *